(12) United States Patent
Collard

(10) Patent No.: US 9,840,667 B2
(45) Date of Patent: Dec. 12, 2017

(54) REVERSE OSMOSIS FOR PURIFYING MIXTURES OF HYDROFLUORIC ACID AND NITRIC ACID

(71) Applicant: SOLVAY SA, Brussels (BE)

(72) Inventor: Jean-Marie Collard, Brussels (BE)

(73) Assignee: SOLVAY SA, Brussels (BE)

( * ) Notice: Subject to any disclaimer, the term of this patent is extended or adjusted under 35 U.S.C. 154(b) by 0 days.

(21) Appl. No.: 14/786,211

(22) PCT Filed: Apr. 16, 2014

(86) PCT No.: PCT/EP2014/057839
§ 371 (c)(1),
(2) Date: Oct. 22, 2015

(87) PCT Pub. No.: WO2014/173788
PCT Pub. Date: Oct. 30, 2014

(65) Prior Publication Data
US 2016/0102250 A1    Apr. 14, 2016

(51) Int. Cl.
| | | |
|---|---|---|
| *C09K 13/08* | (2006.01) | |
| *B01D 61/02* | (2006.01) | |
| *H01L 31/18* | (2006.01) | |
| *C01B 21/46* | (2006.01) | |
| *C01B 7/19* | (2006.01) | |
| *H01M 4/1395* | (2010.01) | |
| *H01L 31/0236* | (2006.01) | |
| *H01M 4/38* | (2006.01) | |

(52) U.S. Cl.
CPC ............ *C09K 13/08* (2013.01); *B01D 61/025* (2013.01); *C01B 7/195* (2013.01); *C01B 21/46* (2013.01); *H01L 31/02363* (2013.01); *H01L 31/1804* (2013.01); *H01M 4/1395* (2013.01); *H01M 4/386* (2013.01); *Y02E 10/50* (2013.01)

(58) Field of Classification Search
None
See application file for complete search history.

(56) References Cited

U.S. PATENT DOCUMENTS

| | | | | |
|---|---|---|---|---|
| 6,444,589 | B1 * | 9/2002 | Yoneya | H01L 21/02019 216/92 |
| 2006/0042539 | A1 * | 3/2006 | Ohta | C30B 29/06 117/13 |
| 2009/0038682 | A1 * | 2/2009 | Komatsu | H01L 31/02363 136/258 |
| 2010/0163487 | A1 * | 7/2010 | Abe | B01D 61/025 210/638 |
| 2011/0147979 | A1 * | 6/2011 | Fragiacomo | B28D 5/007 264/121 |
| 2011/0269019 | A1 * | 11/2011 | Green | H01M 4/049 429/218.1 |

FOREIGN PATENT DOCUMENTS

| | | |
|---|---|---|
| JP | H11 128930 A | 5/1999 |
| JP | 2012125723 A2 | 7/2012 |
| JP | 2012 210595 A | 11/2012 |
| TW | 201 210 942 A | 3/2012 |

OTHER PUBLICATIONS

Mukherjee D et al: "Membrane based system for ultrapure hydrofluoric acid etching solutions", Journal of Membrane Science, Elsevier Scientific Publ. Company. Amsterdam, NL, vol. 109, No. 2, (Jan. 24, 1996), pp. 205-217.

Povorov A A et al: "Hydrofluoric acid recovery integrated membrane technology from glass production concentrated washing waters", Desalination, Elsevier, Amsterdam, NL, vol. 149, No. 1-3, (Sep. 10, 2002), pp. 115-120.

* cited by examiner

*Primary Examiner* — Shamim Ahmed

(57) ABSTRACT

Disclosed is a method of purifying a solution containing hydrofluoric acid, nitric acid and at least one silicon impurity by treating the solution with at least one reverse osmosis membrane. According to the method of the present invention, silicon impurities contained in the solution containing hydrofluoric acid and nitric acid can be selectively removed or reduced. This method can be advantageously used in the photovoltaic industry or in the battery component industry.

20 Claims, No Drawings

REVERSE OSMOSIS FOR PURIFYING MIXTURES OF HYDROFLUORIC ACID AND NITRIC ACID

This application is a U.S. national stage entry under 35 U.S.C. §371 of International Application No. PCT/EP2014/057839 filed Apr. 16, 2014, which claims priority to European patent application No. 13165255.4 filed on 25 Apr. 2013. The entire contents of these applications are explicitly incorporated herein by this reference.

FIELD OF THE INVENTION

The present invention relates to a method of purifying a solution containing hydrofluoric acid, nitric acid and at least silicon impurity. Further, the present invention relates to a process of manufacturing silicon based solar cell or silicon based electrode for battery.

BACKGROUND OF THE INVENTION

During the course of surface processing or surface cleaning of silicon wafer in the photovoltaic manufacturing application, a mixture containing mainly hydrofluoric acid (HF) and nitric acid ($HNO_3$) is used. For example, in a process of surface texturing for crystalline silicon solar cell, such acid mixture solution is used. However, when a fluoronitric acid mixture is applied as the treating solution, silicon impurities, such as fluorosilicic acid (hexafluorosilicic acid or hydrofluorosilicic acid; $H_2SiF_6$), remain in the solution after etching the surface of silicon wafer. The spent solution containing silicon impurities has less etching performance, and thus, the spent solution is sent to waste when the silicon concentration reaches a critical level and a new solution is introduced for further etching process (so called "batch process").

The disposal of the spent $HF/HNO_3$ mixture solution containing high level of silicon impurity is difficult in an industrial size due to high load of fluorine and nitrogen. Also, such disposal leads to high amount of consumption of the mixture solution of hydrofluoric acid and nitric acid, which is not economically favored. As such, an efficient purification and recycling of the spent $HF/HNO_3$ mixture solution containing silicon impurity could be advantageous.

Japanese patent Kokai No. 2012-125723 discloses an apparatus for removing hydrofluorosilicic acid contained in the waste liquid of a nitrohydrofluoric acid, and recovering the refined liquid of the nitrohydrofluoric acid by an electrodialysis having a specific configuration. However, the electrodialysis described in said patent application requires continuous use of further reagents, which may cause another economically unfavorable issue, and in addition, the reduction degree of silicon impurity by the above-mentioned method was not sufficient. For example, the concentration of $H_2SiF_6$ in feed solution which is 2% is reduced to 0.5% at outlet of the purification step in Example 1 of the Japanese patent application.

The invention now makes available an efficient method of purifying the solution which does not show the above-mentioned problems.

DESCRIPTION OF THE INVENTION

Accordingly, it is an object of the present invention to provide an efficient method of purifying a solution containing hydrofluoric acid, nitric acid and at least one silicon impurity.

The present invention therefore relates to a method of purifying a solution containing hydrofluoric acid, nitric acid and at least one silicon impurity by treating the solution with at least one reverse osmosis (RO) membrane. The method of purification according to the present invention can be advantageously used for a process of treating silicon containing surface, in particular, manufacturing silicon based solar cell or silicon based electrode for battery, wherein the solution containing hydrofluoric acid and nitric acid is used for etching the silicon surface of the cell or device.

It has been surprisingly found by the present inventor that the method of the present invention enables very effective and selective removal or reduction of silicon impurity contained in the solution containing hydrofluoric acid and nitric acid, without substantial reduction of the contents of the two acids, thus making the solution available to be advantageously recycled.

In the present invention, "silicon impurity" is understood to denote, in particular, an impurity comprising at least silicon atom and preferably at least one fluorine atom. More particularly, the silicon impurity can be produced by the contact of the solution containing hydrofluoric acid and nitric acid with silicon surface of the object structure. Preferably, in the present invention, silicon impurity includes fluorosilicic acid such as hexafluorosilicic acid $H_2SiF_6$ produced by a contact of said solution with silicon surface of solar cell or of electrode for battery wherein the solution containing hydrofluoric acid and nitric acid is used to treat, process and/or clean such surface. The fluorosilicic acid can be dissociated in the solution, and as such, corresponding anions, for instance $HSiF_6^-$ and $SiF_6^{2-}$, can also exist as the silicon impurity in the solution.

All weight percentages disclosed herein are expressed relative to the total weight of the respective solution.

Further essential feature in the method of the present invention resides on use of at least one reverse osmosis (RO) membrane. The inventor of the present invention has found that RO membrane can reject most of the silicon impurity very effectively while hydrofluoric acid and nitric acid in the solution are not significantly rejected by it.

In the present invention, the RO membranes are preferably selected from the group consisting of flat sheet membrane, spiral wound membrane, and combination thereof.

The reverse osmosis membrane in the present invention can preferably be thin film composite type. As the material of the membrane, polyamides, polypiperazine amides, polyacrylonitriles, polysulfones, cellulose acetates, polybenzimidazolines, polyoxadiazoles, polyfuranes, polyether-polyfuranes, polyvinylamines, polypyrrolidines, carboxylated polysulfones or sulfonated polysulfones can be preferably used. More preferably, the reverse osmosis membrane is made of polyamides, polypiperazine amides, polyacrylonitriles, polysulfones or sulfonated polysulfones, still more preferably polyamides.

In the present invention, the reverse osmosis membrane can be used in a form of membrane module (spiral wound or flat sheet). One or more membrane module(s) can be used in any configuration. Examples of the configuration include series, parallel and combination of series and parallel.

Unlike the solution containing only hydrofluoric acid and silicon impurities often used in semiconductor industry for the purpose of etching, the solution intended to be subject to the purification system of the present invention further comprises nitric acid which may bring the pH of the solution to a very low value, for instance, by 3 to 4 orders of magnitude lower than the hydrofluoric acid etching solution. This in turn increases the ionic strength of the solution, and thus, may cause a substantial impact on the ionic form of the silicon impurities. As such, proper technical operations need to be sought for the efficient purification by the method according to the present invention.

In the present invention, the method can be performed at the temperature from −20° C. to +20° C. Also, the temperature in the method according to the present invention can be no more than +40° C., particularly no more than +30° C. In the present invention, the temperature is preferably around room temperature. Flow can be varied and co-relates to the temperature condition. The pressure for operating RO membrane can be determined according to the exact composition of the solution. According to preferred embodiment, as the purification method primarily targets the solution containing hydrofluoric acid, nitric acid, and at least one silicon impurity, particularly hexafluorosilicic acid, the pressure for operating the method according to the present invention is at least 30 bars. Upper limit of the pressure is usually 100 bars, preferably 70 bars. Excellent results can be attained in accordance with the pressure being in said range.

Various types of the solution containing hydrofluoric acid, nitric acid, and at least one silicon impurity can be the subject of the purification method according to the present invention. For example, the solution containing hydrofluoric acid, nitric acid and at least one silicon impurity can be preferably a solution spent for surface processing or surface cleaning for silicon wafer in photovoltaic field. In addition, the solution can be a spent solution used for etching the surface of silicon electrode for battery, in particular, secondary lithium battery.

Preferably, the solution which can be used for etching the surface of silicon wafer or silicon electrode mainly contains hydrofluoric acid and nitric acid and further contains silicon compound as an impurity.

In the present invention, the content of nitric acid in the solution is preferably from 0.1% w/w to 10% w/w, more preferably from 2% w/w to 10% w/w, most preferably from 4% w/w to 9% w/w, before the purification by RO membrane.

In the present invention, the content of hydrofluoric acid in the solution to be treated can be variable depending on the application wherein the solution was used. The content of hydrofluoric acid in the solution is preferably from 0.001% w/w to 50% w/w, more preferably 0.5% w/w to 30% w/w, most preferably from 1% w/w to 20% w/w, before the purification by RO membrane.

In the present invention, the content of silicon impurity in the fresh solution would preferably be substantially 0% w/w. However, once the solution has been contacted with a silicon containing surface, it will contain certain silicon impurities. The content of silicon impurity in such solution can be variable depending on the application wherein the solution was used. The content of silicon impurity in the solution is preferably from 0.1% w/w to 30% w/w, more preferably from 0.5% w/w to 20% w/w, most preferably from 1% w/w to 10% w/w, before the purification by RO membrane.

In the present invention, at least 90%, in particular at least 95%, especially at least 99% of the silicon impurity in the solution is preferably rejected by a treatment with the RO membrane.

Further, an additional additive can be optionally contained in the solution of the present invention. The examples of such additives include a surfactant, a further acid, such as acetic acid, etc.

The remainder of the solution usually consists of water so as to make up 100% of the solution.

The exact composition of the solution containing hydrofluoric acid and nitric acid can be varied depending on the technology field to be applied.

In the present invention, the solution purified by the reverse osmosis membrane is preferably recycled to a flow of treatment of a silicon containing surface for further use. Such treatment includes a surface texturing of solar cells, in particular silicon based solar cell, or an etching of silicon based electrode for batteries, in particular lithium ion battery, as explained above. Through this recycling process, the spent solution can be recovered and be sent to the circulation of the process for further use and thus consumption of the solution can be drastically reduced.

In the present invention, it is intended to be most preferred to reject all of the silicon impurity in the solution containing hydrofluoric acid and nitric acid by at least one reverse osmosis membrane while maintaining similar or slightly reduced contents of hydrofluoric acid and nitric acid in the solution which is available for further use. However, when the contents of the two acids in the solution are not sufficiently high after the purification with RO membrane, these two acids can be spiked to recover their original concentration in the solution. Therefore, in one particular embodiment of the present invention, the method of purification according to the present invention further comprises a step of adding hydrofluoric acid and/or nitric acid to set the concentration of hydrofluoric acid and nitric acid contained in the solution to a target level. When there are further components other than hydrofluoric acid and/or nitric acid in the solution and if the content of such components in the solution is reduced by the reverse osmosis membrane process, such components can be also added. These optional steps allow to recover a solution suitable for use in a further treatment step of a silicon containing surface.

The method of purifying the solution containing hydrofluoric acid, nitric acid and at least one silicon impurity with at least one reverse osmosis membrane according to the present invention can be advantageously applied for a process of manufacturing silicon (in particular crystalline polysilicon) based solar cell to recycle the solution containing hydrofluoric acid and nitric acid used for texturing the silicon surface. Therefore, another aspect of the present invention is a process for manufacturing silicon based solar cell, at least comprising a step wherein a solution containing hydrofluoric acid, nitric acid and at least one silicon impurity is purified in accordance with the process according to the present invention. The above-described preferences made to the details, such as the contents of hydrofluoric acid, nitric acid and silicon impurity in the solution, the types of RO membrane, the origin and specific compounds of the silicon impurity, the possibility of having further steps, etc., can be similarly adopted in this aspect of the invention.

Also, the method of purifying the solution containing hydrofluoric acid, nitric acid and at least one silicon impurity with at least one reverse osmosis membrane according to the present invention can be advantageously applied for a process of manufacturing silicon based electrode for battery to recycle the solution used for etching the silicon surface of the electrode. Therefore, further aspect of the present invention is a process for manufacturing silicon based electrode for battery, at least comprising a step wherein a solution containing hydrofluoric acid, nitric acid and at least one silicon impurity is purified in accordance with the process according to the present invention. The above-described preferences made to the details, such as the contents of hydrofluoric acid, nitric acid and silicon impurity in the solution, the types of RO membrane, the origin and specific compounds of the silicon impurity, the possibility of having further steps, etc., can be similarly adopted in this aspect of the invention.

Should the disclosure of any patents, patent applications, and publications which are incorporated herein by reference conflict with the description of the present application to the extent that it may render a term unclear, the present description shall take precedence.

The following example illustrates the invention in further detail without however limiting it.

EXAMPLE

Example 1

In order to confirm the performance of the method according to the present invention, a lab scale device model for membrane system is used. A test is made with a small flat sheet membrane unit working in full recirculation mode. Pressure is applied using the feed/recirculation pump, and static pressure is applied using an inert gas, if necessary. The maximum operating pressure is ~30 bars.

A thin film composite polyamide membrane is used for testing.

A feed solution matching the typical composition of a spent acid wafer texturing mixture ($HNO_3$ 5% w/w, HF 2% w/w, and $H_2SiF_6$ 2% w/w) is processed through the membrane. It is demonstrated that over 95% of silicon impurities are rejected by the RO membrane, while approximately ⅔ of the acids are maintained in the permeate.

This clearly demonstrates that silicon is almost completely rejected by the membrane while $HNO_3$ and HF are not significantly rejected by the membrane. Thus, advantage of using reverse osmosis membrane in recycling the acid wafer texturing mixture used in the photovoltaic industry is proven.

The invention claimed is:

1. A method of purifying a solution containing hydrofluoric acid, nitric acid and at least one silicon impurity, the method comprising treating the solution with at least one reverse osmosis membrane,
wherein at least 90% of the at least one silicon impurity is rejected, and wherein hydrofluoric acid and nitric acid in the solution are not significantly rejected.

2. The method according to claim 1, wherein the solution mainly contains hydrofluoric acid and nitric acid and comprises silicon compound as an impurity.

3. The method according to claim 1, wherein the content of nitric acid in the solution before the purification is from 0.1% w/w to 10% w/w.

4. The method according to claim 1, wherein the content of hydrofluoric acid in the solution before the purification is from 0.001% w/w to 50% w/w.

5. The method according to claim 1, wherein the content of silicon impurity in the solution before the purification is from 0.1% w/w to 30% w/w.

6. The method according to claim 1, wherein one or more reverse osmosis membranes are used, in series or in parallel, or in combination of series and parallel.

7. The method according to claim 1, wherein the silicon impurity is generated by contacting a solution containing hydrofluoric acid and nitric acid with a silicon containing surface.

8. The method according to claim 7, wherein the contacting a solution containing hydrofluoric acid and nitric acid with a silicon containing surface is a surface texturing of solar cells or an etching of silicon based electrode for batteries.

9. The method according to claim 7, further comprising recycling the purified solution to a flow of treatment of the silicon containing surface.

10. The method according to claim 1, further comprising a step of adding hydrofluoric acid and/or nitric acid to set the concentration of hydrofluoric acid and nitric acid contained in the solution to a target level.

11. A process of manufacturing a silicon based solar cell, the process comprising purifying a solution containing hydrofluoric acid, nitric acid and at least one silicon impurity in accordance with the method according to claim 1.

12. A process of manufacturing a silicon based electrode for a battery, the process comprising purifying a solution containing hydrofluoric acid, nitric acid and at least one silicon impurity in accordance with the method according to claim 1.

13. The process according to claim 11, further comprising recycling the purified solution to a flow of treatment of a silicon containing surface during the manufacturing process.

14. The process according to claim 11, wherein the reverse osmosis membrane is made of polyamides, polypiperazine amides, polyacrylonitriles, polysulfones, cellulose acetates, polybenzimidazolines, polyoxadiazoles, polyfuranes, polyether-polyfuranes, polyvinyl amines, polypyrolidines, carboxylated polysulfones or sulfonated polysulfones.

15. The process according to claim 12, further comprising recycling the purified solution to a flow of treatment of a silicon containing surface during the manufacturing process.

16. The process according to claim 12, wherein the reverse osmosis membrane is made of polyamides, polypiperazine amides, polyacrylonitriles, polysulfones, cellulose acetates, polybenzimidazolines, polyoxadiazoles, polyfuranes, polyether-polyfuranes, polyvinylamines, polypyrolidines, carboxylated polysulfones or sulfonated polysulfones.

17. The method according to claim 1, wherein the content of nitric acid in the solution before the purification is from 2% w/w to 10% w/w.

18. The method according to claim 1, wherein the content of hydrofluoric acid in the solution before the purification is from 0.5% w/w to 30% w/w.

19. The method according to claim 1, wherein the content of silicon impurity in the solution before the purification is from 0.5% w/w to 20% w/w.

20. The method according to claim 1, wherein ⅔ of the hydrofluoric acid and nitric acid are not rejected.

* * * * *